(12) United States Patent
Hwang et al.

(10) Patent No.: US 6,268,265 B1
(45) Date of Patent: Jul. 31, 2001

(54) TRENCH ISOLATION METHOD FOR SEMICONDUCTOR INTEGRATED CIRCUIT

(75) Inventors: Sun-ha Hwang, Bucheon; Takashi Simada, Seoul, both of (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/346,450

(22) Filed: Jul. 1, 1999

(30) Foreign Application Priority Data

Jul. 7, 1998 (KR) .................................................. 98-27318

(51) Int. Cl.$^7$ .................................................. H01L 21/76
(52) U.S. Cl. .......................... 438/424; 438/424; 438/438; 438/585
(58) Field of Search .................................... 438/424, 428, 438/427, 435, 436, 437, 438, 585

(56) References Cited

U.S. PATENT DOCUMENTS

| | | | |
|---|---|---|---|
| 4,740,480 | 4/1988 | Ooka | 438/436 |
| 5,449,640 | * 9/1995 | Hunt et al. | 148/DIG. 100 |
| 5,492,858 | * 2/1996 | Bose et al. | 438/424 |
| 5,989,978 | * 11/1999 | Peidous | 438/424 |
| 6,040,607 | * 3/2000 | Wristers et al. | 257/389 |

OTHER PUBLICATIONS

Stanley Wolf, "Silicon Processing for the VLSI Era", vol. 3, pp. 224–225 and 371, 1995.

* cited by examiner

Primary Examiner—Michael Trinh
(74) Attorney, Agent, or Firm—Marger Johnson & McCollom, P.C.

(57) ABSTRACT

A trench isolation method is provided for fabricating a semiconductor integrated circuit without a recessed groove that exposes the upper corner of the trench. A mask pattern is formed that exposes a predetermined area. A trench is etched through the mask pattern. Then a thermal oxide film is formed on the side walls and the bottom of the trench. A flowable oxide is then filled in the trench overflowing onto the mask pattern, and formed into a pattern. Then a surface of the flowable oxide film is etched until the mask pattern is exposed, thereby forming a flowable oxide film pattern. Then the exposed mask pattern is removed by a wet etchant, which also etches the flowable oxide film pattern, and thus forms a recessed groove. Then thermal annealing is performed, which eliminates the grooves, and forms an isolation film covering the upper corner of the trench. The thermal oxide film prevents impurities of the flowing oxide from diffusing into the substrate.

12 Claims, 4 Drawing Sheets

TRENCH ISOLATION METHOD FOR SEMICONDUCTOR INTEGRATED CIRCUIT

BACKGROUND OF THE INVENTION

1. Field of the Invention

The present invention relates to a trench isolation method for manufacturing a semiconductor integrated circuit.

2. Description of the Related Art

As the integration density of integrated circuits increases, the technology for forming an isolation region between the active regions becomes important. Trench isolation methods are widely employed for this purpose. In these methods, a trench is formed by etching at a predetermined area of a semiconductor substrate, and then the trench is filled with an insulating material. This increases the effective distance between adjacent transistors in active regions. The area of the isolation region is kept at a minimum by designing the trench to be deep and narrow. This is why the insulating material inside the trench is also called insulating film.

A prior art trench isolation method is now described with reference to FIGS. 1 through 3. Referring to FIG. 1, a pad oxide film, a pad nitride film, and a chemical vapor deposition (CVD) oxide film are sequentially formed on a semiconductor substrate 1. A pad oxide film pattern 3, a pad nitride film pattern 5, and a CVD oxide film pattern 7 for exposing a predetermined area of the semiconductor substrate 1 are formed by continuously patterning the CVD oxide film, the pad nitride film, and the pad oxide film. A trench T is formed by etching exposed semiconductor substrate 1 using CVD oxide film pattern 7 as an etching mask.

Referring to FIG. 2, an insulating material filling the trench T is deposited on the entire surface of the resultant structure where the trench T is formed. The entire surface of the insulating film is etched until pad nitride film pattern 5 is exposed. A CMP process is widely used for this purpose. The insulating film has been formed into an insulating film pattern 9.

Referring to FIG. 3, exposed pad nitride film pattern 5 and pad oxide film pattern 3 are removed. This exposes the active region of the substrate around the trench for further processing. Then insulating film pattern 9 is etched, forming an isolating film 9a that has a recessed groove at an edge A.

The recessed groove exposes an upper corner of the trench accordingly, when a MOS transistor is later formed near the trench, a gate electric field caused by a gate voltage applied between a gate electrode of the MOS transistor and the substrate becomes disproportionately concentrated on the upper corner of the trench. As a result, even though a sub-threshold voltage is being applied to the gate electrode, a channel is nevertheless formed on a side wall of the trench. Accordingly, leakage current flows between a source area and a drain area of the MOS transistor. This phenomenon often occurs in MOS transistors having a narrow channel width. Also, the high concentration of electric field at the upper corner of the trench deteriorates the reliability of a gate oxide film.

SUMMARY OF THE INVENTION

To solve the above problem(s), it is an objective of the present invention to provide a trench isolation method by which the upper corner of the trench is not exposed.

To achieve the above objective, the present invention provides a method for manufacturing an integrated circuit device with a trench. A mask pattern is formed on a semiconductor substrate that exposes a predetermined area. A trench is formed by dry etching at the predetermined area, using the mask pattern as an etching mask. Then a thermal oxide film is formed on the side walls and the bottom of the trench, preferably by oxidation. This corrects local lattice damage from the dry etching process of forming the trench. A flowable oxide is then filled in the trench overflowing onto the mask pattern. Then a surface of the flowable oxide film is etched until the mask pattern is exposed, thereby forming a flowable oxide film pattern. Then the surface of the semiconductor substrate around the trench, i.e., the surface of the active region is exposed by removing the exposed mask pattern by a wet etchant. At this time the flowable oxide film pattern is also etched, thus forming a transformed flowable oxide film pattern having recessed grooves at the edge of the flowable oxide film pattern. Then thermal annealing is performed, which eliminates the grooves, and forms an isolation film covering the upper corner of the trench. The thermal oxide film prevents impurities of the flowing oxide from diffusing into the substrate.

The method of the invention avoids the recessed grooves and the exposed upper corners. Accordingly, devices with improved electrical characteristic can be formed in the active regions.

BRIEF DESCRIPTION OF THE DRAWING

The above objective and advantages of the present invention will become more apparent by describing in detail a preferred embodiment thereof with reference to the attached drawings in which.

DESCRIPTION OF THE PREFERRED EMBODIMENT

Figure 1:
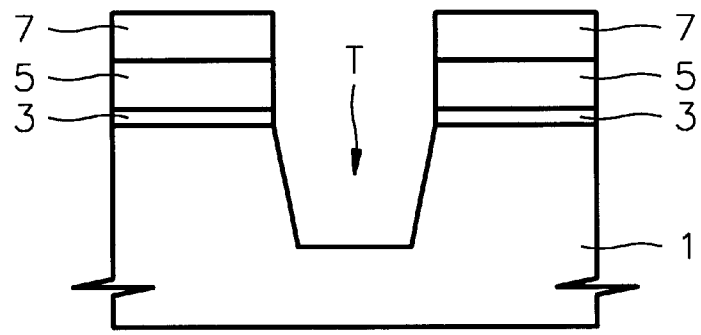
FIGS. 1 through 3 are sectional views of a integrated circuit device undergoing sequential steps of a trench isolation method in the prior art.
Figure 2:
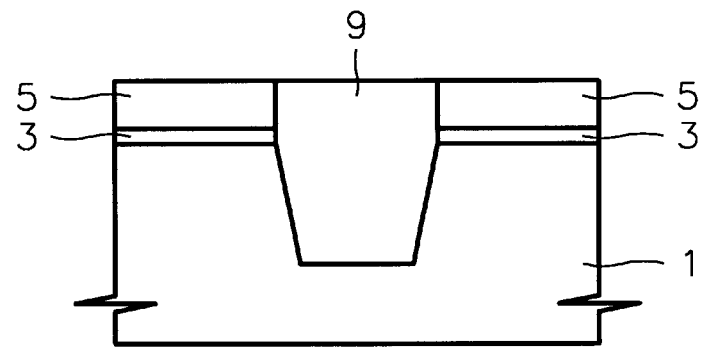
Figure 3:
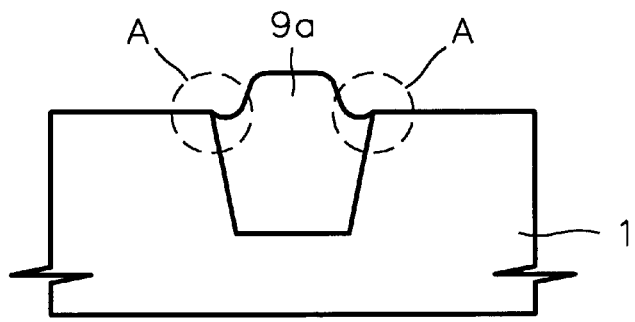
Figure 4:
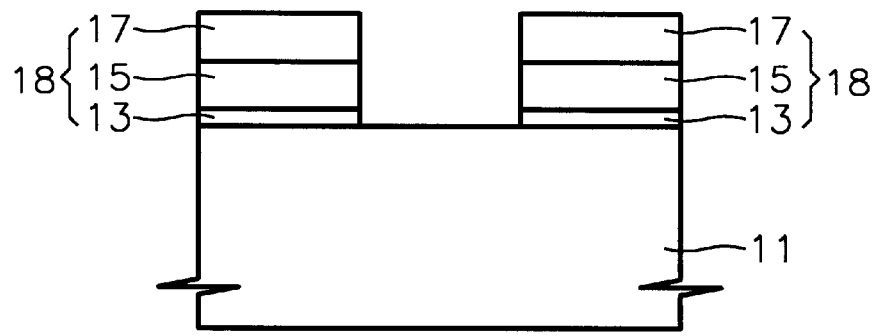
FIGS. 4 through 11 are sectional views of a integrated circuit device undergoing sequential steps of a trench isolation method according to the present invention.

A preferred embodiment of the present invention is now described. Referring to FIG. 4, a buffer layer, and a CMP stopper layer are sequentially formed on a semiconductor substrate 11, e.g. a silicon substrate. The buffer layer is preferably formed of a thermal oxide film. The CMP stopper layer is preferably formed of a material film having a high polishing selectivity when an oxide film deposited thereon is etched by a CMP process. A good candidate is a silicon nitride film. The buffer layer buffers the difference in stress between the CMP stopper layer and substrate 11. Also, a trench etch stopper layer may be further formed on the CMP stopper layer. The trench etch stopper layer is preferably formed of a material film having a high etch selectivity when the semiconductor substrate 11 is dry etched, such as a CVD oxide film.

A buffer layer pattern 13, a CMP stopper layer pattern 15, and a trench etch stopper layer pattern 17 are formed by continuously patterning the trench etch stopper layer, the CMP stopper layer, and the buffer layer. Together, buffer layer pattern 13, CMP stopper layer pattern 15, and trench etch stopper layer pattern 17 constitute a mask pattern 18 for exposing a predetermined area between two active regions.

Figure 5:
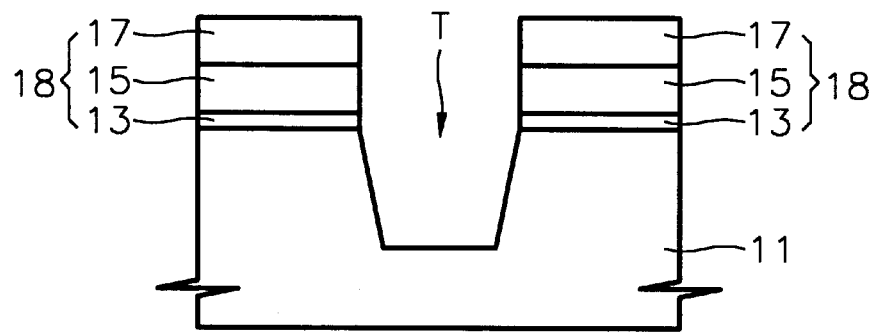

Referring to FIG. 5, a trench T is formed by dry etching exposed substrate 11, using mask pattern 18 as an etching mask. The trench is thus formed at the predetermined area.

Figure 6:
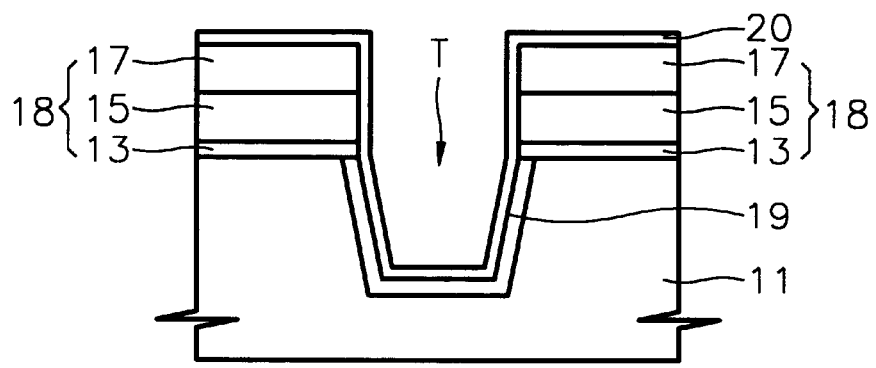

Referring to FIG. 6, it is highly preferred that, at this time, a thin thermal oxide film 19 is formed on the side walls, and also on the bottom of the trench. At a thickness of several tens through hundreds Angstrom, thermal oxide film 19 will prevent impurities of the later applied flowable oxide from diffusing into substrate 11. Thermal oxide film 19 is preferably made by thermally oxidizing the substrate, which further cures any lattice damage inflicted locally during the dry etching process of forming the trench. Also, a thin diffusion barrier layer 20, e.g., a thin silicon nitride layer may be further formed on eentire surface of the resultant structure where the thermal oxide film 19 is formed.

Figure 7:
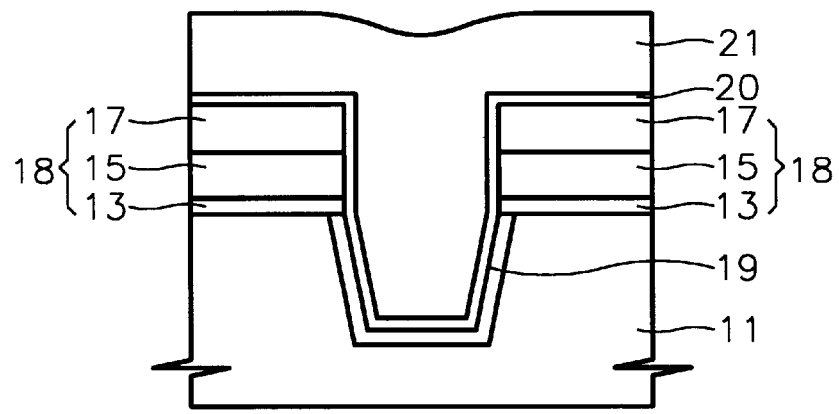

Referring to FIG. 7, a flowable oxide is applied such that it fills the trench, overflows onto mask pattern 18, and forms a flowable oxide film 21 on the overall surface. This is accomplished by depositing a BPSG film by a CVD method at a temperature of 400° C. to 450° C., and flowing (a.k.a. planarizing) the deposited film at a temperature of 800° C.–900° C. The quality of a film is stabilized by flowing the deposited BPSG film by a thermal annealing process. It is preferable that the P and B included in the BPSG film have respective concentrations of 4%–6% and 6%–9% by weight. Alternatively, film 21 may be formed using a PSG film instead of the BPSG film. In that case, the concentration of P is preferably 6%–9% by weight.

Figure 8:
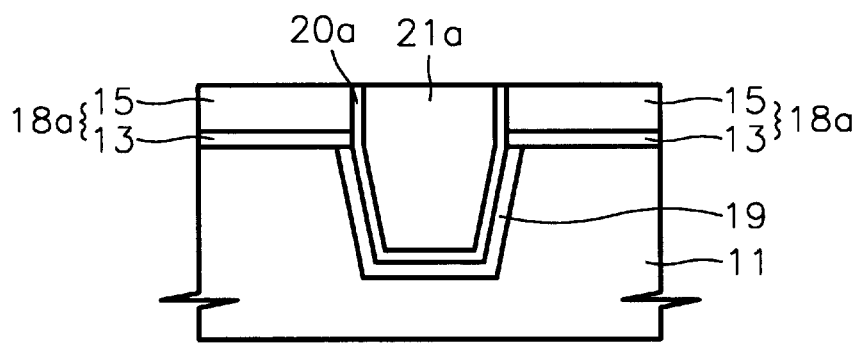

Referring to FIG. 8, the overall surface of flowable oxide film 21 is etched, preferably by a CMP process. This results in forming a flowable oxide film pattern 21a in the trench. The CMP process has also removed the thin diffusion barrier layer and the etch stopper layer pattern 17, i.e. the CVD oxide, thus exposing the CMP stopper layer pattern 15 and forming a diffusion barrier liner 20a. The remaining buffer layer pattern 13 and CMP stopper layer pattern 15 together form exposed mask pattern 18a around the trench, i.e. on the active regions.

Figure 9:
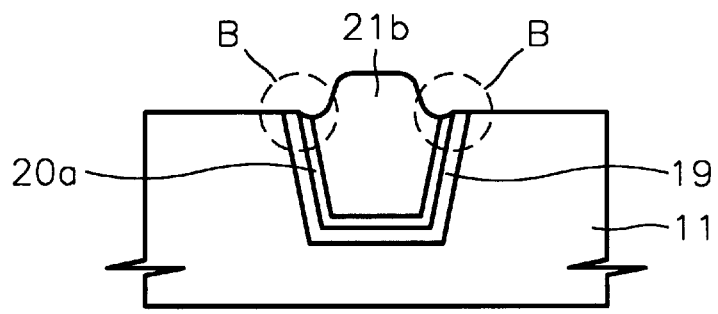

Referring to FIG. 9, exposed mask pattern 18a is removed, thereby exposing the active regions around the trench. Removal can be by a wet etching process. This also etches a part of flowable oxide film pattern 21a, thus forming a transformed flowable oxide film pattern 21b, which has recessed grooves at upper edges B. As said above, these grooves expose the upper corners of the trench. The exposure can result in deteriorated electrical characteristics and reliability of the later formed MOS transistor.

Figure 10:
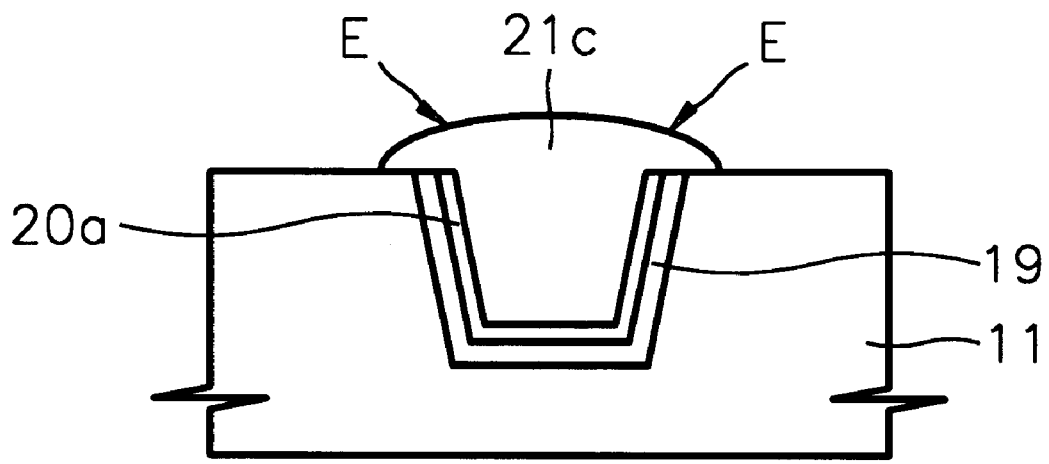
Figure 11:
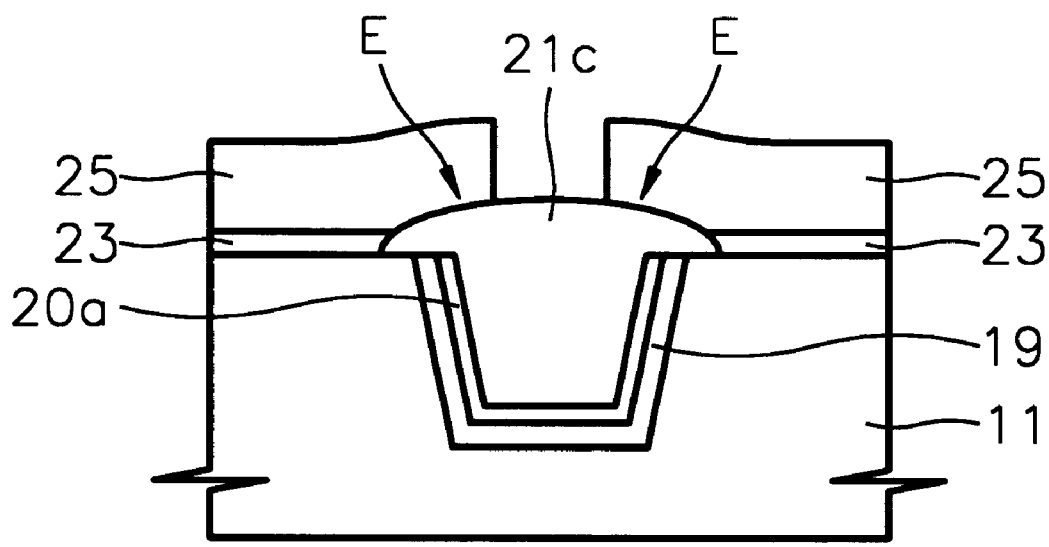

Referring to FIGS. 10 and 11, a subsequent step of the invention is to anneal thermally the semiconductor substrate. This reflows the transformed flowable oxide film pattern 21b, thereby forming an isolation film 21c. A thermal annealing process using a furnace can be used. Alternatively, if the flowable oxide film pattern has been formed from a BPSG film, the thermal annealing is preferably performed by a rapid thermal annealing (RTA) process. The RTA process is preferably performed at a temperature of 1,000° C.–1,150° C. for 10–60 seconds. A gate oxide film 23 is formed on the exposed active regions, and a gate electrode 25 is formed on the gate oxide film 23. Here, the gate electrode 25 extends over the edges of the isolation film 21c.

Importantly, isolamn film 21c has a round surface without recessed grooves. That is because the reflowing process causes upper edge E of isolation film 21c to become redistributed, and thus eliminate the grooves. In fact, edges E extend over the upper edges of the trench, and cover them. This prevent the gate electric field from being concentrated on the upper corner of the trench, when a gate voltage is applied between the semiconductor substrate and the gate electrode 25 of a MOS transistor formed on the active region. This improves the electrical characteristic and the reliability of the MOS transistor formed in the active region.

The present invention is not restricted to the above embodiments, and it is clearly understood that many variations are possible within the scope and spirit of the present invention by a person skilled in the art in view of the present description.

What is claimed is:

1. A trench isolation method for fabricating a semiconductor integrated circuit comprising the steps of:

forming a mask pattern exposing a predetermined area of a semiconductor substrate on the semiconductor substrate;

etching using the mask pattern as an etching mask, thereby forming a trench at the predetermined area;

forming a thermal oxide film on the sidewall and bottom of the trench;

applying a flowable oxide such that the flowable oxide fills the trench, overflows onto the mask pattern, and forms a flowable oxide film thereon;

etching a surface of the flowable oxide film until the mask pattern is exposed, thereby forming a flowable oxide film pattern;

removing the exposed mask pattern to thereby form recessed grooves at the upper edges of the flowable oxide film pattern and expose active regions around the trench;

thermally annealing the flowable oxide film pattern to thereby form an isolation film having a round surface without the grooves; and forming a gate oxide layer on the exposed active regions and gate electrodes on the gate oxide layer sequentially, wherein each gate electrode extends over the edge of the isolation film.

2. The method of claim 1, wherein the step of forming the mask pattern comprises the steps of:

sequentially forming a buffer layer, a CMP stopper layer, and a trench etch stopper layer on the semiconductor substrate; and continuously patterning the trench etch stopper layer, the CMP stopper layer, and the buffer layer, thereby forming a trench etch stopper layer pattern, a CMP stopper layer pattern, and a buffer layer pattern.

3. The method of claim 2, wherein the buffer layer is a thermal oxide film.

4. The method of claim 2, wherein the CMP stopper layer is a silicon nitride film.

5. The method of claim 2, wherein the trench etch stopper layer is a CVD oxide film.

6. The method of claim 1, further comprising the step of forming a diffusion barrier layer on the entire surface of the resultant structure where the thermal oxide film is formed.

7. The method of claim 6, wherein the thermal oxide is formed by oxidizing the substrate.

8. The method of claim 1, wherein the flowable oxide film is a BPSG film.

9. The method of claim 8, wherein the BPSG film is planarized by performing annealing.

10. The method of claim 1, wherein etching the flowable oxide film is performed by a CMP process.

11. The method of claim 1, wherein the step of annealing is performed by a rapid thermal annealing (RTA) process.

12. The method of claim 11, wherein the RTA process is performed at the temperature of 1,000° C.–1,150° C. for 10–60 seconds.

* * * * *

UNITED STATES PATENT AND TRADEMARK OFFICE
CERTIFICATE OF CORRECTION

PATENT NO.     : 6,268,265 B1
DATED          : July 31, 2001
INVENTOR(S)    : Hwang et al.

It is certified that error appears in the above-identified patent and that said Letters Patent is hereby corrected as shown below:

<u>Column 1,</u>
Lines 45, 49, 57 and 63, "comer" should read -- corner --.

<u>Column 2,</u>
Line 17, "comer" should read -- corner --.

<u>Column 3,</u>
Line 9, "eentire" should read -- entire --.
Line 27, "isolamn" should read -- isolation --.
Line 63, "comer" should read -- corner --.

Signed and Sealed this

Fourth Day of June, 2002

*Attest:*

*Attesting Officer*

JAMES E. ROGAN
*Director of the United States Patent and Trademark Office*